United States Patent
Kuang

(10) Patent No.: US 10,283,730 B2
(45) Date of Patent: May 7, 2019

(54) OLED ENCAPSULATION METHOD AND OLED ENCAPSULATION STRUCTURE

(71) Applicant: Shenzhen China Star Optoelectronics Technology Co., Ltd., Shenzhen (CN)

(72) Inventor: Youyuan Kuang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 75 days.

(21) Appl. No.: 15/514,530

(22) PCT Filed: Mar. 16, 2017

(86) PCT No.: PCT/CN2017/076863
§ 371 (c)(1),
(2) Date: Mar. 26, 2017

(87) PCT Pub. No.: WO2018/152897
PCT Pub. Date: Aug. 30, 2018

(65) Prior Publication Data
US 2018/0240999 A1  Aug. 23, 2018

(30) Foreign Application Priority Data
Feb. 21, 2017  (CN) .......................... 2017 1 0093730

(51) Int. Cl.
*H01L 51/00* (2006.01)
*H01L 51/52* (2006.01)
*H01L 51/56* (2006.01)

(52) U.S. Cl.
CPC .......... *H01L 51/5246* (2013.01); *H01L 51/56* (2013.01)

(58) Field of Classification Search
None
See application file for complete search history.

(56) References Cited

U.S. PATENT DOCUMENTS

| | | | | |
|---|---|---|---|---|
| 4,447,565 A | * | 5/1984 | Lula | ....................... C08J 9/0066 264/109 |
| 8,063,561 B2 | * | 11/2011 | Choi | ................... H01L 51/5246 313/500 |

(Continued)

FOREIGN PATENT DOCUMENTS

| CN | 103500755 A | 1/2014 |
|---|---|---|
| CN | 105676546 A | 6/2016 |

(Continued)

*Primary Examiner* — Reema Patel
(74) *Attorney, Agent, or Firm* — Leong C. Lei

(57) ABSTRACT

The present invention provides an OLED encapsulation method and an OLED encapsulation structure. By arranging at least two loops of encapsulation resin frames around an outer circumference of the OLED device, the potential risk of external moisture and oxygen invading can be greatly reduce, and even one of the multiple loops of the encapsulation resin frames appears a defect spot, no influence would occur on the OLED device located internally. Further, by arranging a single or multiple encapsulation resin connection sections between two adjacent loops of the encapsulation resin frames, multiple discontinuous sealed and enclosed spaces are formed between two adjacent loops of the encapsulation resin frames so as to effectively block moisture and oxygen to flow among different ones of the sealed and enclosed spaces, whereby a defect spot occurring in any one of the encapsulation resin frames could only affect the sealed and enclosed space where the defect spot is located and would not affect the sealed and enclosed spaces of other sites so as to better block the invasion of external moisture and oxygen to the OLED device and thus improving encapsulation effectiveness of the OLED device. Based on the two features discussed above, the present invention may overcome the issue of invasion of moisture and oxygen resulting from defect spot caused by aging of an encapsu- (Continued)

lation resin frame and significantly improving light emission quality and service life of the OLED device.

10 Claims, 8 Drawing Sheets

(56) References Cited

U.S. PATENT DOCUMENTS

| | | | | |
|---|---|---|---|---|
| 2007/0172971 A1* | 7/2007 | Boroson | ............ | H01L 51/5246 438/26 |
| 2009/0039780 A1* | 2/2009 | Kim | ........................ | H01J 9/261 313/512 |
| 2016/0260925 A1 | 9/2016 | Hou | | |

FOREIGN PATENT DOCUMENTS

| | | |
|---|---|---|
| CN | 105679961 A | 6/2016 |
| CN | 205723639 U | 11/2016 |

* cited by examiner providing a backing plate and making an OLED device on the backing plate to form an OLED substrate; forming a first encapsulation resin frame on the OLED substrate at a location corresponding to an outer circumference of the OLED device — 1' providing an encapsulation cover plate, forming a second encapsulation resin frame on the encapsulation cover plate at a location corresponding to an outer circumference of the first encapsulation resin frame and forming a single or multiple encapsulation resin connection sections on the encapsulation cover plate at a location corresponding to an area between the first encapsulation resin frame and the second encapsulation resin frame and connected to an inner side of the second encapsulation resin frame — 2' aligning and laminating the encapsulation cover plate with the OLED substrate such that the single or multiple encapsulation resin connection sections that are connected to the inner side of the second encapsulation resin frame are connected to an outer side of the first encapsulation resin frame and the first encapsulation resin frame, the second encapsulation resin frame, and the single or multiple encapsulation resin connection sections hermetically connect the encapsulation cover plate and the OLED substrate together to form an OLED encapsulation structure — 3'

Fig. 9

OLED ENCAPSULATION METHOD AND OLED ENCAPSULATION STRUCTURE

BACKGROUND OF THE INVENTION

1. Field of the Invention

The present invention relates to the field of display technology, and more particular to an organic light-emitting diode (OLED) encapsulation method and an OLED encapsulation structure.

2. The Related Arts

Organic light-emitting display (OLED) possesses various advantages, such as being self-luminous, low drive voltage, high luminous efficiency, short response time, high clarity and contrast, almost 180° view angle, wide range of operation temperature, and easy realization of flexible displaying and large-area full-color displaying, and is considered the most promising display device in the industry.

Based on the way of driving, OLEDs can be classified in two categories, passive matrix OLED (PMOLED) and active matrix OLED (AMOLED), namely two categories of direct addressing and TFT array addressing, among which the AMOLED comprises pixels that are arranged in an array and belongs to an active display type, having high light emission performance and being commonly used in high definition large-sized display devices.

An OLED is generally made up of a substrate, an anode arranged on the substrate, a hole injection layer arranged on and anode, a hole transport layer arranged on the hole injection layer, an emissive layer arranged on the hole transport layer, an electron transport layer arranged on the emissive layer, an electron injection layer arranged on the electron transport layer, and a cathode arranged on the electron injection layer. The principle of light emission of an OLED display device is that when a semiconductor material and an organic light emission material are driven by an electric field, carrier currents are injected and re-combine to cause emission of light. Specifically, the OLED display device often uses an indium tin oxide (ITO) electrode and a metal electrode to respectively serve as anode and cathode of the device and electrons and holes, when driven by a predetermined electrical voltage, are respectively injected into the electron transport layer and the hole transport layer from the cathode and the anode such that the electrons and the holes respectively migrate through the electron transport layer and the hole transport layer to get into the emissive layer and meet in the emissive layer to form excitons to excite light emissive molecules to emit light, the later undergoing radiation relaxation to give off visible light.

A main stream manufacturing process for OLED devices is vapor deposition, which comprises heating an organic small-molecule material in a vacuum chamber to make it sublimating or melting into material vapor, which passes through openings formed in a metal mask to deposit on a glass substrate. Encapsulation of an OLED device is often achieved as follows: An encapsulation resin is applied on an encapsulation cover plate and a desiccant pad is attached. Then, an OLED substrate and the encapsulation cover plate are laminated with each other. Finally, the encapsulation resin is cured to achieve isolation and blocking moisture and oxygen from the OLED device.

With the OLED device being energized and put into operation, the encapsulation resin around the OLED device will get aging, leading to defect spots through which moisture and oxygen may likely invade and speeding up aging of the OLED device, and thus making the lifespan of the OLED device greatly shortened.

FIG. 1 is a cross-sectional view illustrating a conventional OLED encapsulation structure and FIG. 2 is a top plan view of the OLED encapsulation structure of FIG. 1, with an encapsulation cover plate removed. As shown in FIGS. 1 and 2, the OLED encapsulation structure comprises an OLED substrate 100 and an encapsulation cover plate 200' and encapsulation resin 300 arranged between the OLED substrate 100 and the encapsulation cover plate 200 to hermetically connect the OLED substrate 100 and the encapsulation cover plate 200. The OLED substrate 100 comprises a backing plate 110 and an OLED device 120 arranged on the backing plate 110. The encapsulation resin 300 is arranged on an outer circumference of the OLED device 120. It can be seen from FIGS. 1 and 2 that the conventional OLED encapsulation structure comprises only a single loop of encapsulation resin 300 so that with the encapsulation resin 300 getting aging, defect spots 600 may appear in the encapsulation resin 300 and moisture and oxygen may invade to thereby affect the service life of the OLED device 120.

SUMMARY OF THE INVENTION

An objective of the present invention is to provide an organic light-emitting display (OLED) encapsulation method, which significantly improves encapsulation performance of the OLED device and effectively enhances light emission quality and service life of the OLED device.

Another objective of the present invention is to provide an OLED encapsulation structure, which provides a bettered effect of encapsulation of an OLED device and the OLED device may exhibit better light emission quality and extended service life.

To achieve the above objectives, the present invention provides an OLED encapsulation method, which comprises the following steps:

Step 1: providing a backing plate and making an OLED device on the backing plate to form an OLED substrate, and forming a first encapsulation resin frame on the OLED substrate at a location corresponding to an outer circumference of the OLED device;

Step 2: forming a second encapsulation resin frame on the OLED substrate at a location corresponding to an outer circumference of the first encapsulation resin frame and forming a single or multiple encapsulation resin connection sections on the OLED substrate to be located between the first encapsulation resin frame and the second encapsulation resin frame and connecting the first encapsulation resin frame and the second encapsulation resin frame; and Step 3: providing an encapsulation cover plate and aligning and laminating the encapsulation cover plate with the OLED substrate such that the first encapsulation resin frame, the second encapsulation resin frame, and the single or multiple encapsulation resin connection sections hermetically connect the encapsulation cover plate and the OLED substrate together to form an OLED encapsulation structure.

The first encapsulation resin frame, the second encapsulation resin frame, and the single or multiple encapsulation resin connection sections are each formed of a material comprising ultraviolet curable resin or frit.

Step 2 further comprises forming a single or multiple third encapsulation resin frames on the OLED substrate at a location corresponding to an outer circumference of the second encapsulation resin frame, wherein for a single third encapsulation resin frame formed on the OLED substrate at a location corresponding to an outer circumference of the second encapsulation resin frame, Step 2 further comprises forming a single or multiple encapsulation resin connection sections between the second encapsulation resin frame and the third encapsulation resin frame to connect the second encapsulation resin frame and the third encapsulation resin frame; and for multiple third encapsulation resin frames formed on the OLED substrate at a location corresponding to an outer circumference of the second encapsulation resin frame, Step 2 further comprises forming a single or multiple encapsulation resin connection sections between the second encapsulation resin frame and one of the third encapsulation resin frames closest thereto to connect the second encapsulation resin frame and the one of the third encapsulation resin frames closest thereto and also forming a single or multiple encapsulation resin connection sections between the third encapsulation resin frames to connect two adjacent ones of the third encapsulation resin frames.

The present invention also provides an OLED encapsulation method, which comprises the following steps:

Step 1': providing a backing plate and making an OLED device on the backing plate to form an OLED substrate, and forming a first encapsulation resin frame on the OLED substrate at a location corresponding to an outer circumference of the OLED device;

Step 2': providing an encapsulation cover plate, forming a second encapsulation resin frame on the encapsulation cover plate at a location corresponding to an outer circumference of the first encapsulation resin frame and forming a single or multiple encapsulation resin connection sections on the encapsulation cover plate at a location corresponding to an area between the first encapsulation resin frame and the second encapsulation resin frame and connected to an inner side of the second encapsulation resin frame; and Step 3': aligning and laminating the encapsulation cover plate with the OLED substrate such that the single or multiple encapsulation resin connection sections that are connected to the inner side of the second encapsulation resin frame are connected to an outer side of the first encapsulation resin frame and the first encapsulation resin frame, the second encapsulation resin frame, and the single or multiple encapsulation resin connection sections hermetically connect the encapsulation cover plate and the OLED substrate together to form an OLED encapsulation structure.

The first encapsulation resin frame, the second encapsulation resin frame, and the single or multiple encapsulation resin connection sections are each formed of a material comprising ultraviolet curable resin or frit.

Step 2' further comprises forming a single or multiple third encapsulation resin frames on the encapsulation cover plate at a location corresponding to an outer circumference of the second encapsulation resin frame, wherein for a single third encapsulation resin frame formed on the encapsulation cover plate at a location corresponding to an outer circumference of the second encapsulation resin frame, Step 2' further comprises forming a single or multiple encapsulation resin connection sections between the second encapsulation resin frame and the third encapsulation resin frame to connect the second encapsulation resin frame and the third encapsulation resin frame; and for multiple third encapsulation resin frames formed on the encapsulation cover plate at a location corresponding to an outer circumference of the second encapsulation resin frame, Step 2' further comprises forming a single or multiple encapsulation resin connection sections between the second encapsulation resin frame and one of the third encapsulation resin frames closest thereto to connect the second encapsulation resin frame and the one of the third encapsulation resin frames closest thereto and also forming a single or multiple encapsulation resin connection sections between the third encapsulation resin frames to connect two adjacent ones of the third encapsulation resin frames.

The present invention further provides an OLED encapsulation structure, which comprises an OLED substrate and a encapsulation cover plate arranged opposite to each other and a first encapsulation resin frame, a second encapsulation resin frame, and a single or multiple encapsulation resin connection sections arranged between the OLED substrate and the encapsulation cover plate, wherein the OLED substrate comprises a backing plate and an OLED device arranged on the backing plate; the first encapsulation resin frame is arranged at an outer circumference of the OLED device; the second encapsulation resin frame is arranged at an outer circumference of the first encapsulation resin frame; and the single or multiple encapsulation resin connection sections are arranged between the first encapsulation resin frame and the second encapsulation resin frame to connect the first encapsulation resin frame and the second encapsulation resin frame.

The first encapsulation resin frame, the second encapsulation resin frame, and the single or multiple encapsulation resin connection sections are each formed of a material comprising ultraviolet curable resin or frit.

For multiple encapsulation resin connection sections arranged between the first encapsulation resin frame and the second encapsulation resin frame, the multiple encapsulation resin connection sections are uniformly distributed in an area between the first encapsulation resin frame and the second encapsulation resin frame and a spacing distance between any two adjacent ones of the encapsulation resin connection sections is constant.

The OLED encapsulation structure further comprises a single or multiple third encapsulation resin frames arranged between the OLED substrate and the encapsulation cover plate and located on an outer circumference of the second encapsulation resin frame;

wherein for a single third encapsulation resin frame arranged on an outer circumference of the second encapsulation resin frame, the OLED encapsulation structure further comprises a single or multiple encapsulation resin connection sections arranged between the second encapsulation resin frame and the third encapsulation resin frame to connect the second encapsulation resin frame and the third encapsulation resin frame; and for multiple third encapsulation resin frames arranged on an outer circumference of the second encapsulation resin frame, the OLED encapsulation structure further comprises a single or multiple encapsulation resin connection sections arranged between the second encapsulation resin frame and one of the third encapsulation resin frames closest thereto to connect the second encapsulation resin frame and the one of the third encapsulation resin frames closest thereto; and a single or multiple encapsulation resin connection sections arranged between the third encapsulation resin frames to connect two adjacent ones of the third encapsulation resin frames.

The efficacy of the present invention is that the present invention provides an OLED encapsulation method and an OLED encapsulation structure, wherein by arranging at least two loops of encapsulation resin frames around an outer circumference of the OLED device, the potential risk of external moisture and oxygen invading can be greatly reduce, and even one of the multiple loops of the encapsulation resin frames appears a defect spot, no influence would occur on the OLED device located internally. Further, by arranging a single or multiple encapsulation resin connection sections between two adjacent loops of the encapsulation resin frames, multiple discontinuous sealed and enclosed spaces are formed between two adjacent loops of the encapsulation resin frames so as to effectively block moisture and oxygen to flow among different ones of the sealed and enclosed spaces, whereby a defect spot occurring in any one of the encapsulation resin frames could only affect the sealed and enclosed space where the defect spot is located and would not affect the sealed and enclosed spaces of other sites so as to better block the invasion of external moisture and oxygen to the OLED device and thus improving encapsulation effectiveness of the OLED device. Based on the two features discussed above, the present invention may overcome the issue of invasion of moisture and oxygen resulting from defect spot caused by aging of an encapsulation resin frame and significantly improving light emission quality and service life of the OLED device.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings:

FIG. 9 is a flow chart illustrating the second OLED encapsulation method according to the present invention;

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
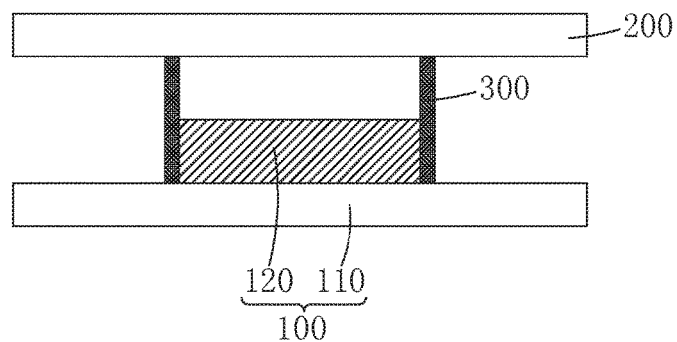
FIG. 1 is a cross-sectional view illustrating a conventional organic light-emitting display (OLED) encapsulation structure.
Figure 2:
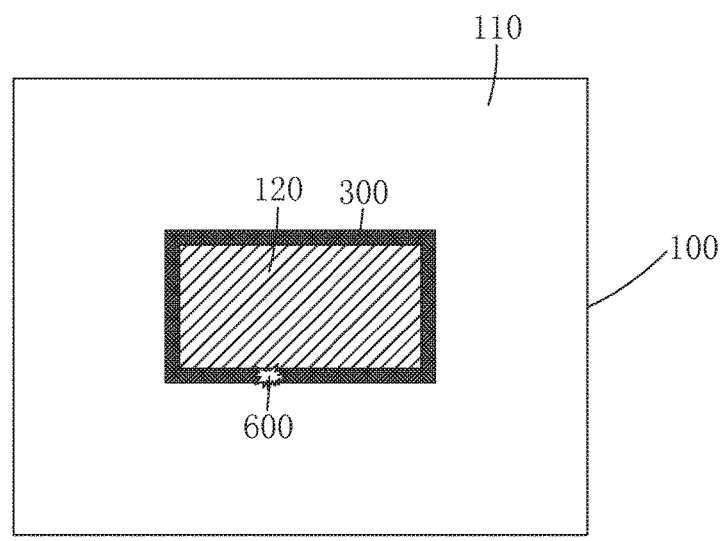
FIG. 2 is a top plan view of the OLED encapsulation structure of FIG. 1 with an encapsulation cover plate removed.
Figure 3:
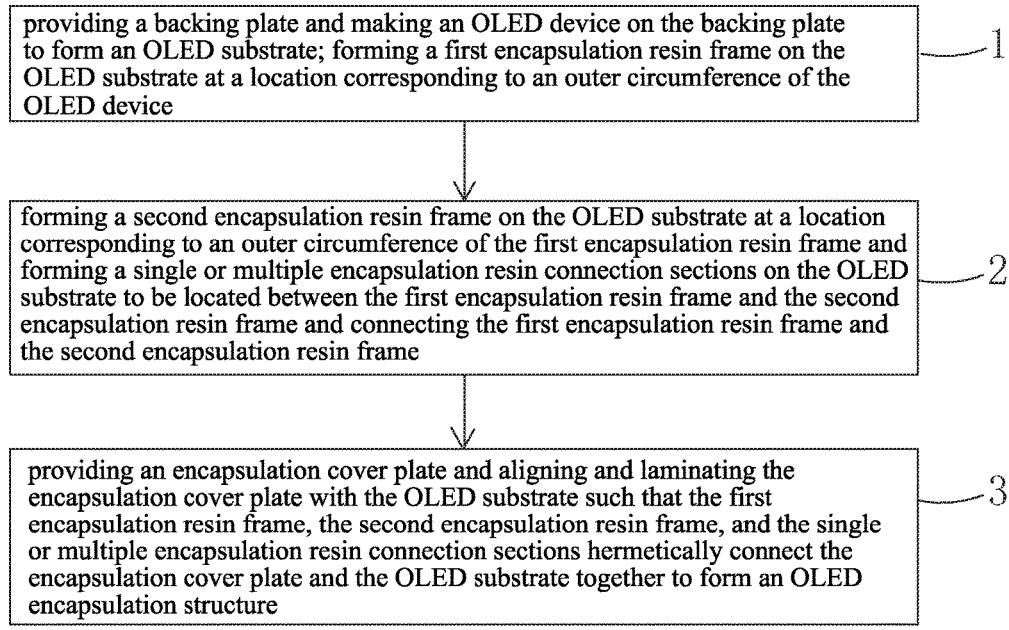
FIG. 3 is a flow chart illustrating a first OLED encapsulation method according to the present invention.
Figure 4:
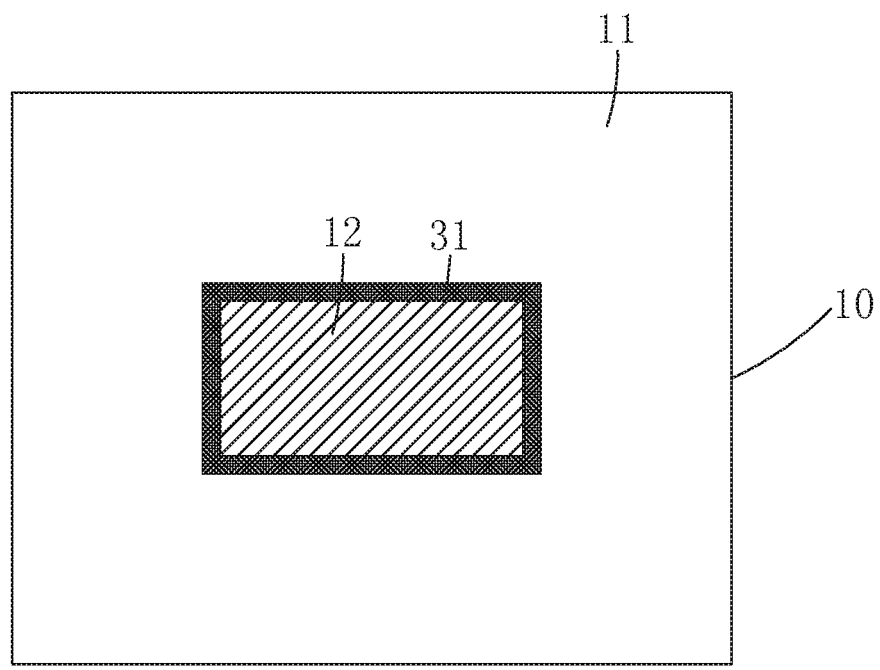
FIG. 4 is a schematic view illustrating Step 1 of the first OLED encapsulation method according to the present invention and is also a schematic view of Step 1' of a second OLED encapsulation method according to the present invention.

Referring to FIG. 3, firstly, the present invention provides a first organic light emitting display (OLED) encapsulation method, which comprises the following steps:

Step 1: as shown in FIG. 4, providing a backing plate 11 and making an OLED device 12 on the backing plate 11 to form an OLED substrate 10, and forming a first encapsulation resin frame 31 on the OLED substrate 10 at a location corresponding to an outer circumference of the OLED device 12.

Specifically, in Step 1, vapor deposition is applied to make the OLED device 12 on the backing plate 11.

Figure 5:
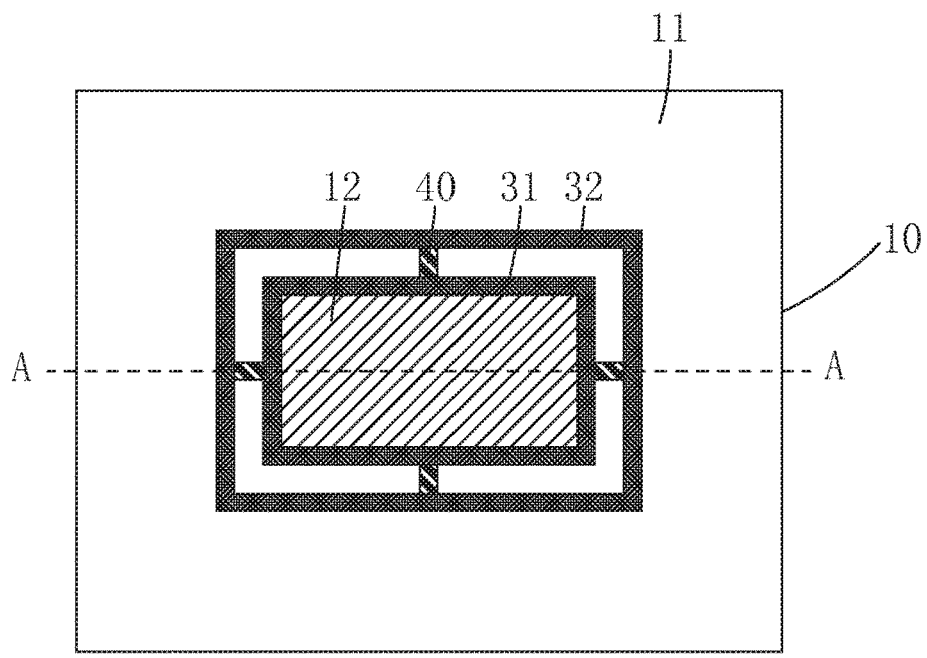
FIG. 5 is a schematic view illustrating a first example of Step 2 of the first OLED encapsulation method, and is also a top plan view illustrating an OLED encapsulation structure, with an encapsulation cover plate removed, formed after a first example of Step 3' of the second OLED encapsulation method, and is also a top plan view illustrating a first example of an OLED encapsulation structure according to the present invention, with an encapsulation cover plate removed.

Step 2: as shown in FIG. 5, forming a second encapsulation resin frame 32 on the OLED substrate 10 at a location corresponding to an outer circumference of the first encapsulation resin frame 31 and forming a single or multiple encapsulation resin connection sections 40 on the OLED substrate 10 to be located between the first encapsulation resin frame 31 and the second encapsulation resin frame 32 and connecting the first encapsulation resin frame 31 and the second encapsulation resin frame 32.

Specifically, in Step 1 and Step 2, the first encapsulation resin frame 31, the second encapsulation resin frame 32, and the single or multiple encapsulation resin connection sections 40 are formed by coating.

Specifically, the first encapsulation resin frame 31, the second encapsulation resin frame 32, and the single or multiple encapsulation resin connection sections 40 are each formed of a material comprising a material capable of blocking moisture and oxygen, such as ultraviolet curable resin and frit.

Specifically, in Step 2, in case that multiple encapsulation resin connection sections 40 are formed between the first encapsulation resin frame 31 and the second encapsulation resin frame 32, the multiple encapsulation resin connection sections 40 are uniformly distributed in an area between the first encapsulation resin frame 31 and the second encapsulation resin frame 32 and a spacing distance between any two adjacent ones of the encapsulation resin connection sections 40 is constant.

Figure 6:
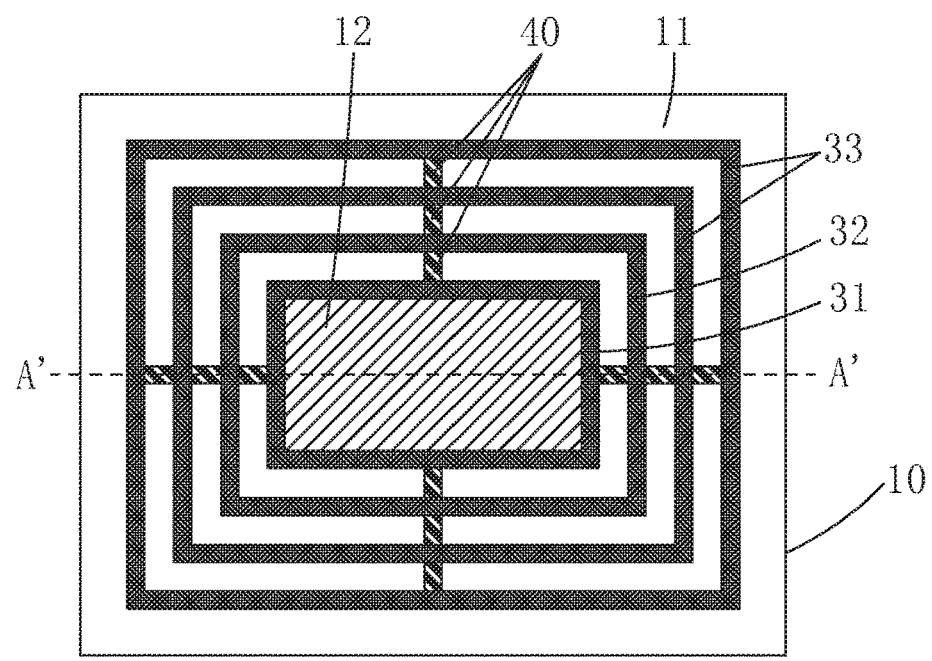
FIG. 6 is a schematic view illustrating a second example of Step 2 of the first OLED encapsulation method, and is also a top plan view illustrating an OLED encapsulation structure, with an encapsulation cover plate removed, formed after a second example of Step 3' of the second OLED encapsulation method, and is also a top plan view illustrating a second example of an OLED encapsulation structure according to the present invention, with an encapsulation cover plate removed.

Preferably, as shown in FIG. 6, Step 2 further comprises forming a single or multiple third encapsulation resin frames 33 on the OLED substrate 10 at a location corresponding to an outer circumference of the second encapsulation resin frame 33, wherein for a single third encapsulation resin frame 33 formed on the OLED substrate 10 at a location corresponding to an outer circumference of the second encapsulation resin frame 32, Step 2 further comprises forming a single or multiple encapsulation resin connection sections 40 between the second encapsulation resin frame 32 and the third encapsulation resin frame 33 to connect the second encapsulation resin frame 32 and the third encapsulation resin frame 33; and for multiple third encapsulation resin frames 33 formed on the OLED substrate 10 at a location corresponding to an outer circumference of the second encapsulation resin frame 32, Step 2 further comprises forming a single or multiple encapsulation resin connection sections 40 between the second encapsulation resin frame 32 and one of the third encapsulation resin frames 33 closest thereto to connect the second encapsulation resin frame 32 and the one of the third encapsulation resin frames 33 closest thereto and also forming a single or multiple encapsulation resin connection sections 40 between the third encapsulation resin frames 33 to connect two adjacent ones of the third encapsulation resin frames 33.

Specifically, the third encapsulation resin frame(s) 33 is formed of a material comprising a material capable of blocking moisture and oxygen, such as ultraviolet curable resin and frit.

Figure 7:
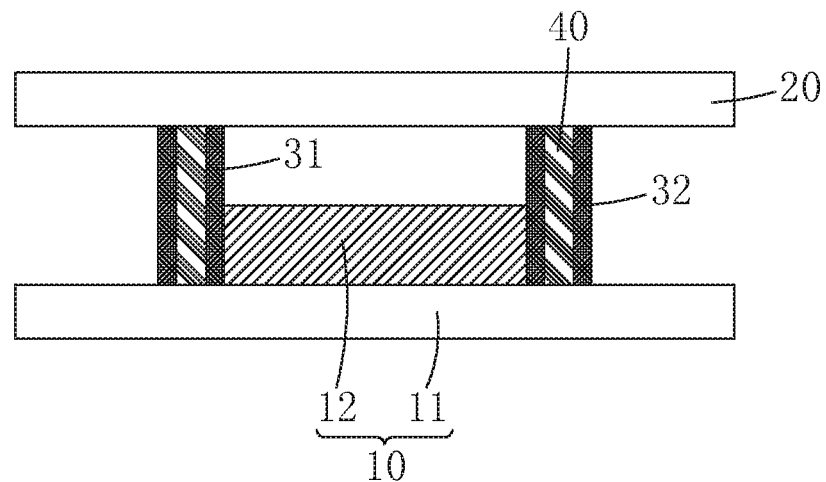
FIG. 7 is a schematic view illustrating a first example of Step 3 of the first OLED encapsulation method, and is also a schematic view illustrating a first example of Step 3' of the second OLED encapsulation method, and is also a cross-sectional view of the first example of the OLED encapsulation structure according to the present invention, taken along line A-A of FIG. 5.
Figure 8:
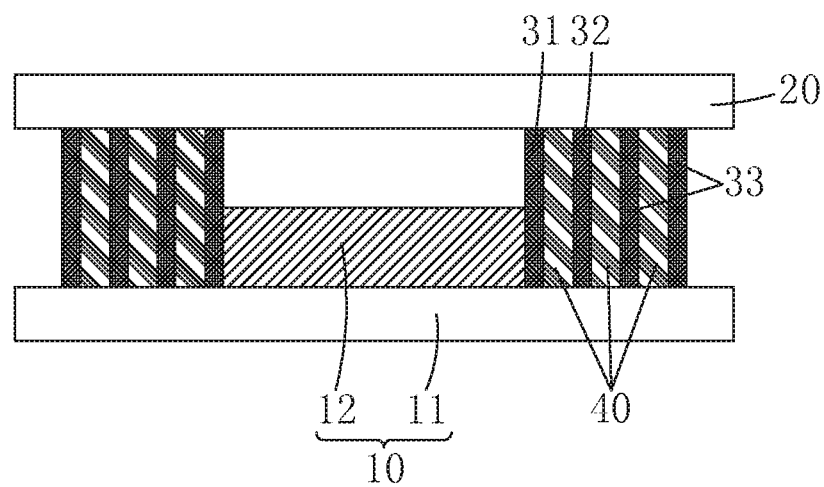
FIG. 8 is a schematic view illustrating a second example of Step 3 of the first OLED encapsulation method, and is also a schematic view illustrating a second example of Step 3' of the second OLED encapsulation method, and is also a cross-sectional view of the second example of the OLED encapsulation structure according to the present invention, taken along line A'-A' of FIG. 6.

Step 3: as shown in FIG. 7 or 8, providing an encapsulation cover plate 20 and aligning and laminating the encapsulation cover plate 20 with the OLED substrate 10 such that the first encapsulation resin frame 31, the second encapsulation resin frame 32 (and optionally, the single or multiple third encapsulation resin frames 33), and the single or multiple encapsulation resin connection sections 40 hermetically connect the encapsulation cover plate 20 and the OLED substrate 10 together to form an OLED encapsulation structure.

Specifically, Step 3 further comprises, after aligning and laminating the encapsulation cover plate 20 with the OLED substrate 10, subjecting the first encapsulation resin frame 31, the second encapsulation resin frame 32 (and optionally, the single or multiple third encapsulation resin frames 33), and the single or multiple encapsulation resin connection sections 40 located between the encapsulation cover plate 20 and the OLED substrate 10 to curing.

In the above OLED encapsulation method, by arranging at least two loops of encapsulation resin frames around an outer circumference of the OLED device 12, the potential risk of external moisture and oxygen invading can be greatly reduce, and even one of the multiple loops of the encapsulation resin frames appears a defect spot, no influence would occur on the OLED device 12 located internally. Further, by arranging a single or multiple encapsulation resin connection sections 40 between two adjacent loops of the encapsulation resin frames, multiple discontinuous sealed and enclosed spaces are formed between two adjacent loops of the encapsulation resin frames so as to effectively block moisture and oxygen to flow among different ones of the sealed and enclosed spaces, whereby a defect spot occurring in any one of the encapsulation resin frames could only affect the sealed and enclosed space where the defect spot is located and would not affect the sealed and enclosed spaces of other sites so as to better block the invasion of external moisture and oxygen to the OLED device 12 and thus improving encapsulation effectiveness of the OLED device 12. Based on the two features discussed above, the present invention may overcome the issue of invasion of moisture and oxygen resulting from defect spot caused by aging of an encapsulation resin frame and significantly improving light emission quality and service life of the OLED device 12.

Referring to FIG. 9, the present invention also provides a second OLED encapsulation method, which comprises the following steps:

Step 1': as shown in FIG. 4, providing a backing plate 11 and making an OLED device 12 on the backing plate 11 to form an OLED substrate 10, and forming a first encapsulation resin frame 31 on the OLED substrate 10 at a location corresponding to an outer circumference of the OLED device 12.

Specifically, in Step 1', vapor deposition is applied to make the OLED device 12 on the backing plate 11.

Figure 10:
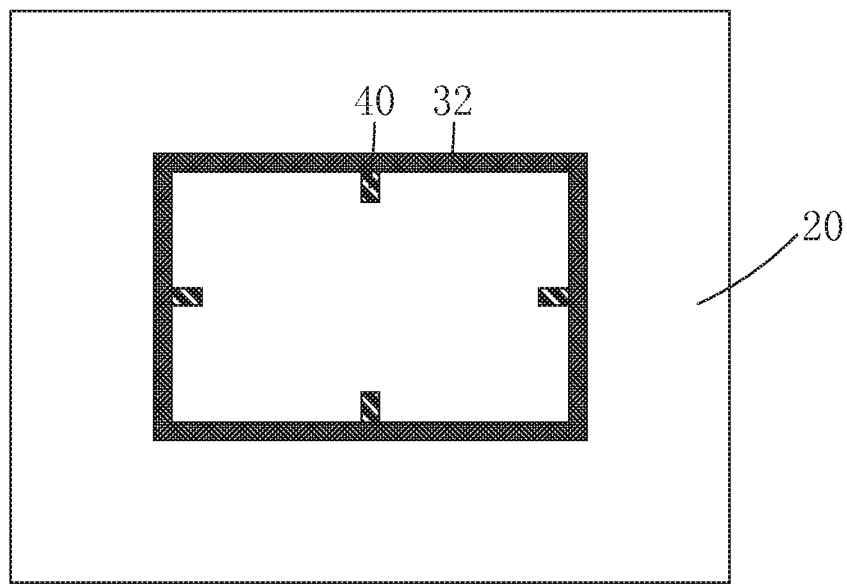
FIG. 10 is a schematic view illustrating a first example of Step 2' of the second OLED encapsulation method according to the present invention.

Step 2': as shown in FIG. 10, providing an encapsulation cover plate 20, forming a second encapsulation resin frame 32 on the encapsulation cover plate 20 at a location corresponding to an outer circumference of the first encapsulation resin frame 31 and forming a single or multiple encapsulation resin connection sections 40 on the encapsulation cover plate 20 at a location corresponding to an area between the first encapsulation resin frame 31 and the second encapsulation resin frame 32 and connected to an inner side of the second encapsulation resin frame 32.

Specifically, in Step 1' and Step 2', the first encapsulation resin frame 31, the second encapsulation resin frame 32, and the single or multiple encapsulation resin connection sections 40 are formed by coating.

Specifically, the first encapsulation resin frame 31, the second encapsulation resin frame 32, and the single or multiple encapsulation resin connection sections 40 are each formed of a material comprising a material capable of blocking moisture and oxygen, such as ultraviolet curable resin and frit.

Specifically, in Step 2', in case that multiple encapsulation resin connection sections 40 are formed on the inner side of the second encapsulation resin frame 32, the multiple encapsulation resin connection sections 40 are uniformly distributed in the area between the first encapsulation resin frame 31 and the second encapsulation resin frame 32 and a spacing distance between any two adjacent ones of the encapsulation resin connection sections 40 is constant.

Figure 11:
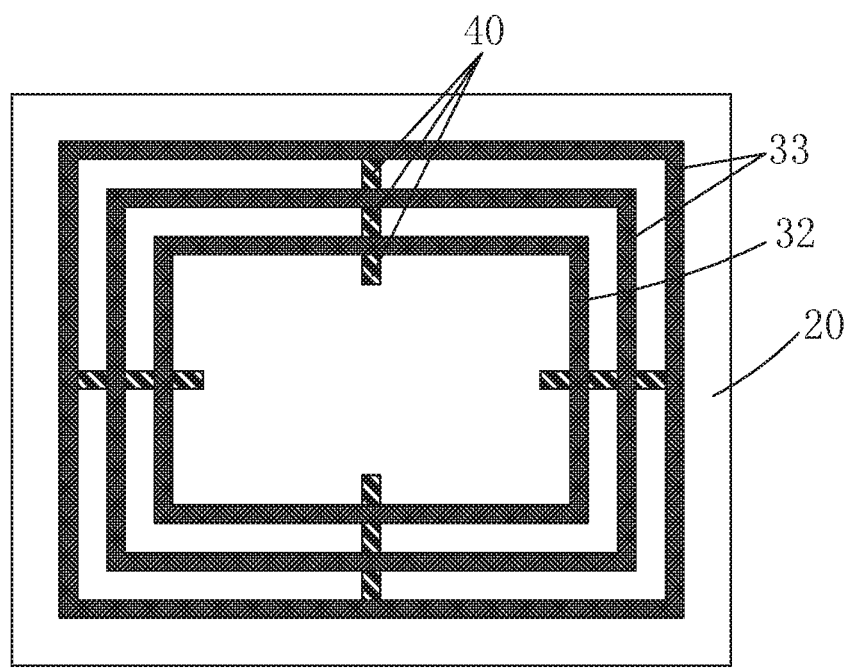
FIG. 11 is a schematic view illustrating a second example of Step 2' of the second OLED encapsulation method according to the present invention.

Preferably, as shown in FIG. 11, Step 2' further comprises forming a single or multiple third encapsulation resin frames 33 on the encapsulation cover plate 20 at a location corresponding to an outer circumference of the second encapsulation resin frame 33, wherein for a single third encapsulation resin frame 33 formed on the encapsulation cover plate 20 at a location corresponding to an outer circumference of the second encapsulation resin frame 32, Step 2' further comprises forming a single or multiple encapsulation resin connection sections 40 between the second encapsulation resin frame 32 and the third encapsulation resin frame 33 to connect the second encapsulation resin frame 32 and the third encapsulation resin frame 33; and for multiple third encapsulation resin frames 33 formed on the encapsulation cover plate 20 at a location corresponding to an outer circumference of the second encapsulation resin frame 32, Step 2' further comprises forming a single or multiple encapsulation resin connection sections 40 between the second encapsulation resin frame 32 and one of the third encapsulation resin frames 33 closest thereto to connect the second encapsulation resin frame 32 and the one of the third encapsulation resin frames 33 closest thereto and also forming a single or multiple encapsulation resin connection sections 40 between the third encapsulation resin frames 33 to connect two adjacent ones of the third encapsulation resin frames 33.

Specifically, the third encapsulation resin frame(s) 33 is formed of a material comprising a material capable of blocking moisture and oxygen, such as ultraviolet curable resin and frit.

Step 3': referring to FIG. 7 or 8, in combination with FIG. 5 or 6, aligning and laminating the encapsulation cover plate 20 with the OLED substrate 10 such that the single or multiple encapsulation resin connection sections 40 that are connected to the inner side of the second encapsulation resin frame 32 are connected to an outer side of the first encapsulation resin frame 31 and the first encapsulation resin frame 31, the second encapsulation resin frame 32 (and optionally, the single or multiple third encapsulation resin frames 33), and the single or multiple encapsulation resin connection sections 40 hermetically connect the encapsulation cover plate 20 and the OLED substrate 10 together to form an OLED encapsulation structure.

Specifically, Step 3' further comprises, after aligning and laminating the encapsulation cover plate 20 with the OLED substrate 10, subjecting the first encapsulation resin frame 31, the second encapsulation resin frame 32 (and optionally, the single or multiple third encapsulation resin frames 33), and the single or multiple encapsulation resin connection sections 40 located between the encapsulation cover plate 20 and the OLED substrate 10 to curing.

In the above OLED encapsulation method, by arranging at least two loops of encapsulation resin frames around an outer circumference of the OLED device 12, the potential risk of external moisture and oxygen invading can be greatly reduce, and even one of the multiple loops of the encapsulation resin frames appears a defect spot, no influence would occur on the OLED device 12 located internally thereof. Further, by arranging a single or multiple encapsulation resin connection sections 40 between two adjacent loops of the encapsulation resin frames, multiple discontinuous sealed and enclosed spaces are formed between two adjacent loops of the encapsulation resin frames so as to effectively block moisture and oxygen to flow among different ones of the sealed and enclosed spaces, whereby a defect spot occurring in any one of the encapsulation resin frames could only affect the sealed and enclosed space where the defect spot is located and would not affect the sealed and enclosed spaces of other sites so as to better block the invasion of external moisture and oxygen to the OLED device 12 and thus improving encapsulation effectiveness of the OLED device 12. Based on the two features discussed above, the present invention may overcome the issue of invasion of moisture and oxygen resulting from defect spot caused by aging of an encapsulation resin frame and significantly improving light emission quality and service life of the OLED device 12.

Referring to FIGS. 7 and 5, based on the two OLED encapsulation methods described above, the present invention also provides a first example of an OLED encapsulation structure, which comprises an OLED substrate 10 and a encapsulation cover plate 20 arranged opposite to each other and a first encapsulation resin frame 31, a second encapsulation resin frame 32, and a single or multiple encapsulation resin connection sections 40 arranged between the OLED substrate 10 and the encapsulation cover plate 20, wherein the OLED substrate 10 comprises a backing plate 11 and an OLED device 12 arranged on the backing plate 11; the first encapsulation resin frame 31 is arranged at an outer circumference of the OLED device 12; the second encapsulation resin frame 32 is arranged at an outer circumference of the first encapsulation resin frame 31; and the single or multiple encapsulation resin connection sections 40 are arranged between the first encapsulation resin frame 31 and the second encapsulation resin frame 32 to connect the first encapsulation resin frame 31 and the second encapsulation resin frame 32.

Specifically, the first encapsulation resin frame 31, the second encapsulation resin frame 32, and the single or multiple encapsulation resin connection sections 40 are each formed of a material comprising a material capable of blocking moisture and oxygen, such as ultraviolet curable resin and frit.

Specifically, for multiple encapsulation resin connection sections 40 arranged between the first encapsulation resin frame 31 and the second encapsulation resin frame 32, the multiple encapsulation resin connection sections 40 are uniformly distributed in an area between the first encapsulation resin frame 31 and the second encapsulation resin frame 32 and a spacing distance between any two adjacent ones of the encapsulation resin connection sections 40 is constant.

Figure 12:
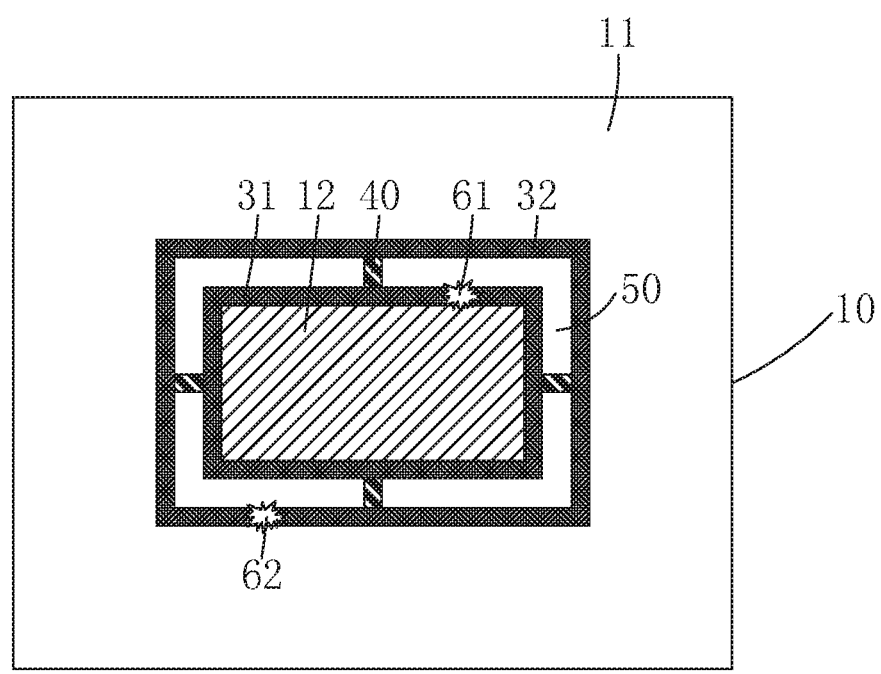
FIG. 12 is a schematic view illustrating the principle of blocking moisture and oxygen according to the first example of the OLED encapsulation structure of the present invention.

FIG. 12 is a schematic view illustrating the principle of blocking moisture and oxygen according to the first example of the OLED encapsulation structure of the present invention. As shown in FIG. 12, in the first example of the OLED encapsulation structure, the single or multiple encapsulation resin connection sections 40 form multiple discontinuous sealed and enclosed spaces 50 between the first encapsulation resin frame 31 and the second encapsulation resin frame 32. With the first encapsulation resin frame 31 and the second encapsulation resin frame 32 getting aging, when a first defect spot 61 and a second defect spot 62 respectively appear in the first encapsulation resin frame 31 and the second encapsulation resin frame 32 and the first defect spot 61 and the second defect spot 62 are respectively located at borders of different ones of the sealed and enclosed spaces 50, the outer circumference of the OLED device 12 is maintained effectively enclosed by the first encapsulation resin frame 31 or the second encapsulation resin frame 32 so that no moisture and oxygen is allowed to enter the interior of the OLED device 12. As such, the OLED encapsulation structure still maintains powerful capability of blocking moisture and oxygen.

Specifically, Referring to FIGS. 8 and 6, a second example of the OLED encapsulation structure according to the present invention. Compared to the first example of the OLED encapsulation structure according to the present invention, the second example of the OLED encapsulation structure according to the present invention further comprises a single or multiple third encapsulation resin frames 33 arranged between the OLED substrate 10 and the encapsulation cover plate 20 and located on an outer circumference of the second encapsulation resin frame 32;

wherein for a single third encapsulation resin frame 33 arranged on an outer circumference of the second encapsulation resin frame 32, the OLED encapsulation structure further comprises a single or multiple encapsulation resin connection sections 40 arranged between the second encapsulation resin frame 32 and the third encapsulation resin frame 33 to connect the second encapsulation resin frame 32 and the third encapsulation resin frame 33; and for multiple third encapsulation resin frames 33 arranged on an outer circumference of the second encapsulation resin frame 32, the OLED encapsulation structure further comprises a single or multiple encapsulation resin connection sections 40 arranged between the second encapsulation resin frame 32 and one of the third encapsulation resin frames 33 closest thereto to connect the second encapsulation resin frame 32 and the one of the third encapsulation resin frames 33 closest thereto; and a single or multiple encapsulation resin connection sections 40 arranged between the third encapsulation resin frames 33 to connect two adjacent ones of the third encapsulation resin frames 33.

Specifically, the third encapsulation resin frame(s) 33 is formed of a material comprising a material capable of blocking moisture and oxygen, such as ultraviolet curable resin and frit.

In the above OLED encapsulation structure, by arranging at least two loops of encapsulation resin frames around an outer circumference of the OLED device 12, the potential risk of external moisture and oxygen invading can be greatly reduce, and even one of the multiple loops of the encapsulation resin frames appears a defect spot, no influence would occur on the OLED device 12 located internally. Further, by arranging a single or multiple encapsulation resin connection sections 40 between two adjacent loops of the encapsulation resin frames, multiple discontinuous sealed and enclosed spaces 50 are formed between two adjacent loops of the encapsulation resin frames so as to effectively block moisture and oxygen to flow among different ones of the sealed and enclosed spaces 50, whereby a defect spot occurring in any one of the encapsulation resin frames could only affect the sealed and enclosed space 50 where the defect spot is located and would not affect the sealed and enclosed spaces 50 of other sites so as to better block the invasion of external moisture and oxygen to the OLED device 12 and thus improving encapsulation effectiveness of the OLED device 12. Based on the two features discussed above, the present invention may overcome the issue of invasion of moisture and oxygen resulting from defect spot caused by aging of an encapsulation resin frame and significantly improving light emission quality and service life of the OLED device 12.

In summary, the present invention provides an OLED encapsulation method and an OLED encapsulation structure, wherein by arranging at least two loops of encapsulation resin frames around an outer circumference of the OLED device, the potential risk of external moisture and oxygen invading can be greatly reduce, and even one of the multiple loops of the encapsulation resin frames appears a defect spot, no influence would occur on the OLED device located internally. Further, by arranging a single or multiple encapsulation resin connection sections between two adjacent loops of the encapsulation resin frames, multiple discontinuous sealed and enclosed spaces are formed between two adjacent loops of the encapsulation resin frames so as to effectively block moisture and oxygen to flow among different ones of the sealed and enclosed spaces, whereby a defect spot occurring in any one of the encapsulation resin frames could only affect the sealed and enclosed space where the defect spot is located and would not affect the sealed and enclosed spaces of other sites so as to better block the invasion of external moisture and oxygen to the OLED device and thus improving encapsulation effectiveness of the OLED device. Based on the two features discussed above, the present invention may overcome the issue of invasion of moisture and oxygen resulting from defect spot caused by aging of an encapsulation resin frame and significantly improving light emission quality and service life of the OLED device.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. An organic light emitting display (OLED) encapsulation method, comprising the following steps:
   Step 1: providing a backing plate and making an OLED device on the backing plate to form an OLED substrate, and
   forming a first encapsulation resin frame on the OLED substrate at a location corresponding to an outer circumference of the OLED device;
   Step 2: forming a second encapsulation resin frame on the OLED substrate at a location corresponding to an outer circumference of the first encapsulation resin frame and forming multiple encapsulation resin connection sections on the OLED substrate to be located between the first encapsulation resin frame and the second encapsulation resin frame and connecting the first encapsulation resin frame and the second encapsulation resin frame; and
   Step 3: providing an encapsulation cover plate and aligning and laminating the encapsulation cover plate with the OLED substrate such that the first encapsulation resin frame, the second encapsulation resin frame, and the multiple encapsulation resin connection sections hermetically connect the encapsulation cover plate and the OLED substrate together to form an OLED encapsulation structure;
   wherein the multiple encapsulation resin connection sections divide a space between the first encapsulation resin frame and the second encapsulation resin frame into multiple discontinuous sealed and enclosed spaces.

2. The OLED encapsulation method as claimed in claim 1, wherein the first encapsulation resin frame, the second encapsulation resin frame, and the multiple encapsulation resin connection sections are each formed of a material comprising ultraviolet curable resin or frit.

3. The OLED encapsulation method as claimed in claim 1, wherein Step 2 further comprises forming a single or multiple third encapsulation resin frames on the OLED substrate at a location corresponding to an outer circumference of the second encapsulation resin frame,
   wherein for a single third encapsulation resin frame formed on the OLED substrate at a location corresponding to an outer circumference of the second encapsulation resin frame, Step 2 further comprises forming multiple encapsulation resin connection sections between the second encapsulation resin frame and the third encapsulation resin frame to connect the second encapsulation resin frame and the third encapsulation resin frame; and
   for multiple third encapsulation resin frames formed on the OLED substrate at a location corresponding to an outer circumference of the second encapsulation resin frame, Step 2 further comprises forming multiple encapsulation resin connection sections between the second encapsulation resin frame and one of the third encapsulation resin frames closest thereto to connect the second encapsulation resin frame and the one of the third encapsulation resin frames closest thereto and also forming multiple encapsulation resin connection sections between the third encapsulation resin frames to connect two adjacent ones of the third encapsulation resin frames.

4. An organic light emitting display (OLED) encapsulation method, comprising the following steps:
   Step 1': providing a backing plate and making an OLED device on the backing plate to form an OLED substrate, and
   forming a first encapsulation resin frame on the OLED substrate at a location corresponding to an outer circumference of the OLED device;
   Step 2': providing an encapsulation cover plate, forming a second encapsulation resin frame on the encapsulation cover plate at a location corresponding to an outer circumference of the first encapsulation resin frame and forming multiple encapsulation resin connection sections on the encapsulation cover plate at a location corresponding to an area between the first encapsulation resin frame and the second encapsulation resin frame and connected to an inner side of the second encapsulation resin frame; and
   Step 3': aligning and laminating the encapsulation cover plate with the OLED substrate such that the multiple encapsulation resin connection sections that are connected to the inner side of the second encapsulation resin frame are connected to an outer side of the first encapsulation resin frame and the first encapsulation resin frame, the second encapsulation resin frame, and the multiple encapsulation resin connection sections hermetically connect the encapsulation cover plate and the OLED substrate together to form an OLED encapsulation structure;
   wherein the multiple encapsulation resin connection sections divide a space between the first encapsulation resin frame and the second encapsulation resin frame into multiple discontinuous sealed and enclosed spaces.

5. The OLED encapsulation method as claimed in claim 4, wherein the first encapsulation resin frame, the second encapsulation resin frame, and the multiple encapsulation resin connection sections are each formed of a material comprising ultraviolet curable resin or frit.

6. The OLED encapsulation method as claimed in claim 4, wherein Step 2' further comprises forming a single or multiple third encapsulation resin frames on the encapsulation cover plate at a location corresponding to an outer circumference of the second encapsulation resin frame,
   wherein for a single third encapsulation resin frame formed on the encapsulation cover plate at a location corresponding to an outer circumference of the second encapsulation resin frame, Step 2' further comprises forming multiple encapsulation resin connection sections between the second encapsulation resin frame and the third encapsulation resin frame to connect the second encapsulation resin frame and the third encapsulation resin frame; and
   for multiple third encapsulation resin frames formed on the encapsulation cover plate at a location corresponding to an outer circumference of the second encapsulation resin frame, Step 2' further comprises forming multiple encapsulation resin connection sections between the second encapsulation resin frame and one of the third encapsulation resin frames closest thereto to connect the second encapsulation resin frame and the one of the third encapsulation resin frames closest thereto and also forming multiple encapsulation resin connection sections between the third encapsulation resin frames to connect two adjacent ones of the third encapsulation resin frames.

7. An organic light emitting display (OLED) encapsulation structure, comprising an OLED substrate and a encapsulation cover plate arranged opposite to each other and a first encapsulation resin frame, a second encapsulation resin frame, and multiple encapsulation resin connection sections arranged between the OLED substrate and the encapsulation cover plate, wherein the OLED substrate comprises a backing plate and an OLED device arranged on the backing plate; the first encapsulation resin frame is arranged at an outer circumference of the OLED device; the second encapsulation resin frame is arranged at an outer circumference of the first encapsulation resin frame; and the multiple encapsulation resin connection sections are arranged between the first encapsulation resin frame and the second encapsulation resin frame to connect the first encapsulation resin frame and the second encapsulation resin frame;
   wherein the multiple encapsulation resin connection sections divide a space between the first encapsulation resin frame and the second encapsulation resin frame into multiple discontinuous sealed and enclosed spaces.

8. The OLED encapsulation structure as claimed in claim 7, wherein the first encapsulation resin frame, the second encapsulation resin frame, and the multiple encapsulation resin connection sections are each formed of a material comprising ultraviolet curable resin or frit.

9. The OLED encapsulation structure as claimed in claim 7, wherein the multiple encapsulation resin connection sections are uniformly distributed in the space between the first encapsulation resin frame and the second encapsulation resin frame and a spacing distance between any two adjacent ones of the encapsulation resin connection sections is constant.

10. The OLED encapsulation structure as claimed in claim 7 further comprising a single or multiple third encapsulation resin frames arranged between the OLED substrate and the encapsulation cover plate and located on an outer circumference of the second encapsulation resin frame;
   wherein for a single third encapsulation resin frame arranged on an outer circumference of the second encapsulation resin frame, the OLED encapsulation structure further comprises multiple encapsulation resin connection sections arranged between the second encapsulation resin frame and the third encapsulation resin frame to connect the second encapsulation resin frame and the third encapsulation resin frame; and
   for multiple third encapsulation resin frames arranged on an outer circumference of the second encapsulation resin frame, the OLED encapsulation structure further comprises multiple encapsulation resin connection sections arranged between the second encapsulation resin frame and one of the third encapsulation resin frames closest thereto to connect the second encapsulation resin frame and the one of the third encapsulation resin frames closest thereto; and multiple encapsulation resin connection sections arranged between the third encapsulation resin frames to connect two adjacent ones of the third encapsulation resin frames.

* * * * *